US010457592B2

(12) United States Patent
Canova et al.

(10) Patent No.: US 10,457,592 B2
(45) Date of Patent: Oct. 29, 2019

(54) METHOD FOR PRODUCING A SUBSTRATE COATED WITH A STACK INCLUDING A CONDUCTIVE TRANSPARENT OXIDE FILM (71) Applicant: SAINT-GOBAIN GLASS FRANCE, Courbevoie (FR)

(72) Inventors: Lorenzo Canova, Paris (FR); Driss Lamine, Antony (FR); Nicolas Nadaud, Paris (FR); Sébastien Roy, Houilles (FR); Nisita Wanakule, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 22 days.

(21) Appl. No.: 15/029,656

(22) PCT Filed: Oct. 14, 2014

(86) PCT No.: PCT/FR2014/052615
§ 371 (c)(1),
(2) Date: Apr. 15, 2016

(87) PCT Pub. No.: WO2015/055944
PCT Pub. Date: Apr. 23, 2015

(65) Prior Publication Data
US 2016/0229741 A1 Aug. 11, 2016

(30) Foreign Application Priority Data

Oct. 17, 2013 (FR) ...................................... 13 60092
Apr. 16, 2014 (FR) ...................................... 14 53402

(51) Int. Cl.
*C03C 17/36* (2006.01)
*C03C 17/34* (2006.01)
(Continued)

(52) U.S. Cl.
CPC ...... *C03C 17/3668* (2013.01); *C03C 17/3423* (2013.01); *C03C 17/3435* (2013.01);
(Continued)

(58) Field of Classification Search
CPC ............ C03C 17/3668; C03C 17/3423; C03C 17/3649; C03C 17/3689
See application file for complete search history.

(56) References Cited

U.S. PATENT DOCUMENTS

2010/0282301 A1    11/2010  Peter et al.
2011/0212311 A1*    9/2011  Lemmer ............. C03C 17/3417
                                                            428/212
(Continued)

FOREIGN PATENT DOCUMENTS

CN         101910082 A    12/2010
WO    WO 2010/139908 A1   12/2010
(Continued)

OTHER PUBLICATIONS

International Preliminary Report on Patentability and the Written Opinion of the International Searching Authority as issued in International Patent Application No. PCT/FR2014/052615, dated Apr. 19, 2016.
(Continued)

*Primary Examiner* — Michael P Wieczorek
(74) *Attorney, Agent, or Firm* — Pillsbury Winthrop Shaw Pittman LLP (57) ABSTRACT A process for obtaining an item including a substrate made of glass or glass ceramic coated on at least one portion of at least one of its faces with a stack of thin-layers including no silver layers and including at least one thin layer of a transparent electrically conductive oxide, the process including: a step of depositing the stack, in which step the thin layer of a transparent electrically conductive oxide and at
(Continued)

least one thin homogenizing layer are deposited, the thin homogenizing layer being a metal layer or a layer based on a metal nitride other than aluminum nitride, or a layer based on metal carbide; then a heat treatment step in which the stack is exposed to radiation.

23 Claims, 1 Drawing Sheet

(51) Int. Cl.
    *C23C 14/08*     (2006.01)
    *C23C 14/06*     (2006.01)
    *C23C 14/58*     (2006.01)
    *C23C 14/18*     (2006.01)
    *C23C 14/35*     (2006.01)

(52) U.S. Cl.
    CPC ...... *C03C 17/3441* (2013.01); *C03C 17/3626* (2013.01); *C03C 17/3649* (2013.01); *C03C 17/3689* (2013.01); *C23C 14/0635* (2013.01); *C23C 14/0641* (2013.01); *C23C 14/086* (2013.01); *C23C 14/185* (2013.01); *C23C 14/35* (2013.01); *C23C 14/5813* (2013.01); *C03C 2217/948* (2013.01); *C03C 2218/156* (2013.01); *C03C 2218/32* (2013.01)

(56) References Cited

U.S. PATENT DOCUMENTS

2012/0048722 A1   3/2012   McLean et al.
2012/0087005 A1*  4/2012   Reymond ............... C03C 17/36
                                                    359/360

FOREIGN PATENT DOCUMENTS

WO   WO 2010/142926 A1   12/2010
WO   WO 2012/080684 A1    6/2012

OTHER PUBLICATIONS

International Search Report as issued in International Patent Application No. PCT/FR2014/052615, dated Jan. 9, 2015.

* cited by examiner

METHOD FOR PRODUCING A SUBSTRATE COATED WITH A STACK INCLUDING A CONDUCTIVE TRANSPARENT OXIDE FILM

CROSS-REFERENCE TO RELATED APPLICATIONS

This application is the U.S. National Stage of PCT/FR2014/052615, filed Oct. 14, 2014, which in turn claims priority to French Application No. 1360092, filed Oct. 17, 2013 and French Application No. 1453402, filed Apr. 16, 2014. The contents of all of these applications are incorporated herein by reference in their entirety.

The invention relates to the manufacture of items comprising a substrate made of glass or glass ceramic and a coating comprising at least one thin layer of a transparent electrically conductive oxide.

Transparent electrically conductive oxides, called "TCOs", deposited in the form of thin layers on glazing substrates, have multiple applications: their low emissivity makes them useful in energy-transfer reduction applications (glazing units having enhanced thermal insulation properties, anti-condensation glazing units, etc.) whereas their low electrical resistivity allows them to be used as electrodes, for example in solar cells, active glazing units or screens, or even as heating layers.

These layers are often deposited by vacuum techniques, in particular by magnetron cathode sputtering, and a subsequent heat treatment often proves to be necessary to activate the layer, i.e. to decrease its electrical resistivity by improving its crystal properties.

Application WO 2010/139908 describes a method for carrying out a heat treatment of a layer by means of radiation, in particular infrared or visible laser radiation, focused on the layer. Such a treatment allows the TCO layer to be very rapidly heated without significantly heating the substrate. In particular, the temperature at any point on that face of the substrate which is opposite the face bearing the layer is kept below 150° C., in particular 100° C. during the heat treatment. Other types of radiation, such as that emitted by flash lamps are also usable for the same purpose.

The aim of the present invention is to improve these techniques, by providing a method allowing an optically more homogenous coating to be obtained.

Specifically, it turns out that the application of known treatments is liable to cause optical homogeneity problems, in particular in the case of large substrates treated at high treatment rates (compatible with the rate of deposition of the coating) with radiation having a high power density, for example laser radiation or the radiation emitted by flash lamps.

For large substrates, such as those used in the glazing industry, i.e. substrates measuring 6×3.2 m² for example, the TCO layers are not perfectly homogenous before heat treatment.

In the case of a laser line, it is very difficult from an industrial point of view to obtain a long laser line that is perfectly homogenous in terms of power and geometry, in particular in terms of line width. The run speed of the substrate is also liable to vary.

In the case of flash lamps, it may be difficult to obtain a large lamp (for example of at least 1 or 2 m in length) that emits light homogeneously over its entire length. This technology furthermore requires the substrate to be exposed to a series of discontinuous flashes, and thus the successively irradiated regions must partially overlap if the area to be treated is to be treated in its entirety. The plane of the substrate therefore contains spatial heterogeneities, with different regions having been exposed to different numbers of flashes (for example some regions having been exposed to two flashes and others to only one).

Now, the inventors have demonstrated that in the case of TCO layers small heterogeneities in the absorption of the layer or small treatment heterogeneities, for example in terms of the power of the radiation (for example of the laser or flash lamp), may lead to very visible heterogeneities, in particular variations in color in reflection, after treatment.

To remedy this problem, one subject of the invention is a process for obtaining an item comprising a substrate made of glass or glass ceramic coated on at least one portion of at least one of its faces with a stack of thin-layers comprising at least one thin layer of a transparent electrically conductive oxide, said process comprising:
    a step of depositing said stack, in which step said thin layer of a transparent electrically conductive oxide and at least one thin homogenizing layer are deposited, said thin homogenizing layer being a metal layer or a layer based on a metal nitride other than aluminum nitride, or a layer based on a metal carbide; then
    a heat treatment step in which said stack is exposed to radiation.

The radiation is in particular laser radiation focused on said coating in the form of at least one laser line. It may also be emitted by at least one flash lamp.

The heat treatment is advantageously such that during the treatment the temperature at any point on that face of the substrate which is opposite the face bearing the thin transparent electrically conductive oxide layer does not exceed 150° C., in particular 100° C. and even 50° C.

Another subject of the invention is an item obtainable by way of the process according to the invention.

The inventors have demonstrated that the presence in the stack of a metal layer or a layer based on a metal nitride (other than aluminum nitride) or on a metal carbide allows the combined effect of heterogeneities in the TCO layer and in the parameters of the radiation source (in particular the laser line) to be "ironed out", and large substrates coated with one or more TCO layers that are perfectly homogenous, in particular from the optical point of view, to be obtained. Thus, these thin layers are qualified "homogenizing layers" in the present text.

The substrate is made of glass or glass ceramic. It is preferably transparent, colorless (it is then a question of a clear or extra-clear glass) or tinted, for example blue, gray, green or bronze. The glass is preferably soda-lime-silica glass, but it may also be a borosilicate or alumino-borosilicate glass in particular for high-temperature applications (oven doors, fireplace inserts, fire-resistant glazing units). The substrate advantageously possesses at least one dimension larger than or equal to 1 m, even 2 m and even 3 m. The thickness of the substrate generally varies between 0.1 mm and 19 mm, preferably between 0.7 and 9 mm, in particular between 1 and 6 mm and even between 2 and 4 mm.

The glass substrate is preferably a float glass substrate, i.e. a substrate liable to have been obtained by a process consisting in pouring molten glass onto a molten tin bath (the "float" bath). In this case, the coating to be treated may either be deposited on the "tin face" or on the "atmosphere face" of the substrate. The expressions "atmosphere face" and "tin face" are understood to mean the substrate face that made contact with the atmosphere above the float bath and the substrate face that made contact with the molten tin, respectively. The tin face contains a small amount of superficial tin having diffused into the structure of the glass. The glass substrate may also be obtained by rolling between two rollers, this technique in particular allowing features to be printed into the surface of the glass. The transparent conductive oxide (TCO) is preferably chosen from indium tin oxide (ITO), indium zinc oxide (IZO), antimony- or fluorine-doped tin oxide (ATO and FTO), aluminum- and/or gallium- and/or titanium-doped zinc oxide (AZO, GZO or TZO, respectively), niobium- and/or tantalum-doped titanium oxide and zinc or cadmium stannate.

A very preferable oxide is indium tin oxide, frequently called "ITO". The atomic percentage of Sn is preferably comprised in a range extending from 5 to 70%, in particular from 6 to 60% and advantageously from 8 to 12%. Relative to other conductive oxides, such as fluorine-doped tin oxide, ITO is preferred for its high electrical conductivity, as this means that a good emissivity or resistivity level is obtainable with small thicknesses. The items obtained thus have a high light transmission, which is advantageous in most of the targeted applications. ITO may furthermore be easily deposited by magnetron cathode sputtering, with a good yield and a high deposition rate.

The stack may comprise a single layer of a transparent conductive oxide. It may advantageously comprise a plurality thereof, in particular two or three. Specifically, it turns out that, for a given total thickness of TCO, the use of a plurality of TCO layers, instead of a single thicker layer, allows the homogeneity of the treatment to be further improved, in particular for high treatment rates. When the stack comprises a plurality of TCO layers, the TCO is preferably the same in all these layers. In the case of ITO, this embodiment has proved to be preferable for large ITO thicknesses, for example physical thicknesses of at least 120 nm. Specifically, thick layers are more difficult to treat homogenously at high rates, and it is thus preferable to divide the TCO layer into a plurality of thinner individual layers separated by at least one dielectric layer. The physical thickness of the thin layer of a transparent electrically conductive oxide is preferably at least 30 nm and at most 5000 nm, in particular at least 50 nm and at most 2000 nm. When the stack contains a plurality of thin layers of a transparent electrically conductive oxide, these numbers pertain to the total physical thickness, i.e. the sum of the physical thicknesses of each of these layers.

Thickness will most of the time be determined by the desired sheet resistance or emissivity, these two quantities being very closely correlated. It furthermore turns out that the aforementioned heterogeneity problems become increasingly critical as the thickness of the TCO is increased.

For low-emissivity or anti-condensation glazing units, the targeted emissivity will generally be between 0.15 and 0.50. The term "emissivity" is understood to mean the normal emissivity at 283 K as defined in standard EN 12898.

For applications as electrodes, a sheet resistance of at most 15Ω, in particular 10Ω will generally be targeted.

In the case of ITO, the physical thickness is preferably at least 30 nm, in particular 50, even 70 nm and even 100 nm. It is generally at most 800 nm, in particular 500 nm.

In the case of layers of GZO or AZO, the atomic content of aluminum or gallium is preferably comprised in a range extending from 1 to 5%. The physical thicknesses are preferably comprised in a range extending from 60 to 1500 nm, in particular from 100 to 1000 nm.

In the case of FTO, the physical thickness is preferably at least 300 nm, in particular 500 nm and at most 5000 nm, in particular 3000 nm.

Here again, these various numbers pertain if applicable to the total physical thickness of transparent conductive oxide, when the stack comprises a plurality of these layers.

The inventors have also observed that the oxidation state of the (or each) TCO layer has an influence on the homogeneity of the layer after the heat treatment. It turns out to be preferable in this respect to deposit relatively oxidized layers, having therefore relatively low light absorption. In particular (but not only) in the case of ITO it is preferable for the ratio of the light absorption to the physical thickness of the TCO layer to be comprised in a range extending from 0.1 to 0.9 $\mu m^{-1}$ before heat treatment, in particular from 0.2 to 0.7 $\mu m^{-1}$. For example, for a TCO layer having a light absorption of 3% and a physical thickness of 100 nm (=0.1 $\mu m$), this ratio is equal to $0.03/0.1=0.3$ $\mu m^{-1}$. The light absorption of the TCO layer is determined by depositing only this layer on the glass, under the same deposition conditions, and calculated by subtracting the light absorption of the substrate from the measured light absorption. The latter is for its part calculated by subtracting from the value 1 the light transmission and light reflection as defined in standard ISO 9050:2003. These relatively low absorptions, evidencing a quite high oxidation, may be obtained, during the deposit of the ITO layer by cathode sputtering, by adjusting the oxygen flow rate in the plasma gas. When the stack comprises a plurality of TCO layers, it is the total thickness of TCO (sum of the thicknesses of each of the layers) and the total absorption that must be taken into consideration.

The stack preferably comprises a single thin homogenizing layer, in particular a single metal layer.

During the heat treatment, the thin homogenizing layer will generally oxidize at least partially or even completely. The metal, the metal nitride or the metal carbide will therefore at least partially become an oxide of the metal in question.

Preferably, the thin homogenizing (in particular metal) layer is located above the layer of a transparent electrically conductive oxide, or if applicable, above that layer of a transparent electrically conductive oxide which is furthest from the substrate. It is even advantageously the last layer of the stack, thus being in direct contact with the atmosphere, in particular in order to facilitate its oxidation.

The expression "above" must be understood to mean that the thin homogenizing (in particular metal) layer is further from the substrate than the layer of a transparent electrically conductive oxide. However, this expression should not be understood as precluding direct contact between the two layers, as explained in more detail below.

In another embodiment, the thin homogenizing (in particular metal) layer is located below the layer of a transparent electrically conductive oxide (between the substrate and the latter, optionally but not necessarily making contact therewith), or if applicable below the layer of a transparent conductive oxide closest to the substrate. Even in this case, the thin homogenizing (in particular metal) layer will generally be at least partially oxidized, oxygen being able to diffuse through the overlying layers. This embodiment is particularly advantageous, in particular in the case where the material is intended to be an electrode: since the TCO layer is not surmounted by an insulating layer (case of the oxidized metal layer), the electrical contact is more easily preserved.

The thin homogenizing layer is preferably a metal layer chosen from layers of a metal chosen from titanium, tin, zirconium, zinc, aluminum, cerium or any one of their alloys, in particular an alloy of tin and zinc or even an alloy of titanium and zirconium.

The metal is preferably not silver, copper or an alloy of nickel and chromium.

The stack furthermore preferably comprises no silver layers.

Among these metals, titanium has proved to be particularly advantageous because it enables high treatment rates.

According to another embodiment, the thin homogenizing layer is based on a metal nitride, in particular chosen from titanium nitride, hafnium nitride, zirconium nitride or any one of their solid solutions, in particular titanium zirconium nitride.

According to another embodiment, the thin homogenizing layer is based on a metal carbide, in particular chosen from titanium carbide, tungsten carbide or any one of their solid solutions.

Preferably, the thin homogenizing (in particular metal) layer is at least partially, even completely, oxidized during the heat treatment so as not to penalize the light transmission of the final product. The final product will therefore generally contain a layer of an at least partially oxidized, or even completely oxidized, metal or nitride or carbide, for example $TiO_x$, $ZrO_x$, $TiZrO_x$, $ZnSnO_x$, $TiO_xN_y$, $TiZrO_xN_y$, etc.

For this reason, the physical thickness of the thin homogenizing (in particular metal) layer is preferably at most 15 nm and even 10 nm or even 8 nm. The physical thickness of the thin homogenizing (in particular metal, and more particularly titanium) layer is preferably at least 1, even 2 nm.

When it is located above the TCO layer (if applicable, above the TCO layer furthest from the substrate) and an application as an electrode is targeted, the thin homogenizing (in particular metal) layer is preferably quite thin so that, after oxidation, the insulating layer obtained does not hinder electrical contact. The thickness of the thin homogenizing (in particular metal) layer is in this case advantageously at most 5 nm.

In the case of titanium, its at least partial oxidization gives rise, after the heat treatment, to titanium oxide. When self-cleaning properties are desired, the titanium layer is placed above the TCO layer (or if applicable above the TCO layer furthest from the substrate), the titanium layer advantageously forming the last layer of the stack, and the titanium oxide obtained is preferably at least partially crystallized in the anatase form. Thicknesses of metal titanium of at least 4 nm and of at most 8 or 10 nm are preferred so that, after treatment, the thickness of titanium oxide is sufficiently high to obtain a satisfactory photocatalytic activity. If photocatalytic properties are not sought for the final product, titanium thicknesses of at least 2 nm and at most 5 nm are enough.

It goes without saying that any combination of the materials preferred for the TCO layer and the thin homogenizing (in particular metal) layer, respectively, is possible, even though they are not all explicitly mentioned here for obvious reasons of concision. By way of nonlimiting example, mention may in particular be made of the combinations ITO/Zr, ITO/Ti, ITO/ZnSn, AZO/Zr, AZO/Ti, AZO/ZnSn, GZO/Zr, GZO/Ti, GZO/ZnSn, ITO/TiN, ITO/TiZrN.

Preferably, the stack covers the entirety of the surface of one face of the substrate or even of both faces of the substrate. As indicated above, the stack may comprise only a single TCO layer, but it may of course comprise two or more thereof, for example three or four thereof. In this case, a single thin homogenizing (in particular metal) layer will generally be required, the latter being located above the TCO layer furthest from the substrate.

The stack (before heat treatment) may consist of a TCO layer and the thin homogenizing (in particular metal) layer, in particular an ITO layer surmounted by a titanium layer.

The stack may also comprise other layers than the latter. The stack may in particular comprise at least one dielectric layer between the substrate and the TCO layer and/or at least one dielectric layer between the TCO layer and the thin homogenizing layer. Preferably, the thin homogenizing (in particular metal) layer is the last layer of the stack and therefore makes contact with the atmosphere during the heat treatment. The dielectric layers are preferably layers made of aluminum or silicon nitride, oxide or oxynitride, in particular of silicon nitride or oxynitride.

When the stack comprises a plurality of TCO layers, there is between two of these layers at least one, preferably only one, dielectric layer, in particular a dielectric layer based on or (essentially) consisting of silica. The physical thickness of this dielectric layer is preferably comprised in a range extending from 5 to 100 nm, in particular from 10 to 80 nm and even from 20 to 60 nm.

The stack preferably comprises no layers soluble in a solvent, in particular an aqueous solvent.

The stack may in particular comprise, between the substrate and the TCO layer (if applicable the TCO layer closest to the substrate), at least one neutralizing layer or stack of layers. In the case of a single layer, its refractive index is preferably comprised between the refractive index of the substrate and the refractive index of the TCO layer. Such layers or stacks of layers make it possible to influence the appearance of the item in reflection, in particular its color in reflection. Bluish colors, characterized by a negative b* color coordinate, are generally preferred. By way of nonlimiting example, it is possible to use a layer of mixed silicon tin oxide ($SiSnO_x$), silicon oxynitride or oxycarbide, aluminum oxide or mixed titanium silicon oxide. A stack layers comprising two layers of high and low index respectively, for example a $TiO_x/SiO(N)_x$, $SiN_x/SiO_x$ or $ITO/SiO_x$ stack is also usable, the high-index layer being the layer closest the substrate. The physical thickness of this or these layers is preferably comprised in a range extending from 2 to 100 nm, in particular from 5 to 50 nm. The preferred neutralizing layers or stacks are a neutralizing layer made of silicon oxynitride or a $SiN_x/SiO_x$ stack.

The neutralizing layer or stack preferably makes direct contact with the TCO layer (if applicable the TCO layer closest the substrate). When located between the latter and the substrate, the neutralizing layer or stack may also serve to block possible migration of ions such as alkali-metal ions.

It is possible to place an adhesion layer between the substrate and the neutralizing layer or stack. This layer, which advantageously has a refractive index similar to that of the glass substrate, allows improving the resistance to tempering by promoting the adhesion of the neutralizing layer. The adhesive layer is preferably made of silicon or silicon nitride. Its physical thickness is preferably comprised in a range extending from 20 to 200 nm, in particular from 30 to 150 nm.

The stack may also comprise, between the TCO layer (if applicable the TCO layer furthest from the substrate) and the thin homogenizing layer, an oxygen barrier layer preferably based on (or essentially consisting of) a material chosen from the nitrides or oxynitrides, in particular of silicon or aluminum, or from oxides of titanium, zirconium, zinc and mixed zinc tin oxides. Possible materials are specially silicon nitride, aluminum nitride, silicon oxynitride, aluminum oxynitride, titanium oxide, zirconium oxide, zinc oxide, zinc tin oxide or any one of their mixtures. Very preferably, the oxygen barrier layer is based on silicon nitride or essentially consists of silicon nitride. Silicon nitride indeed forms a very effective barrier to oxygen and may be rapidly deposited by magnetron cathode sputtering. The term "silicon nitride" does not preclude the presence of other atoms than silicon and nitrogen, or restrict the actual stoichiometry of the layer. The silicon nitride indeed preferably comprises a small amount of one or more atoms, typically aluminum or boron, added by way of dopants in the silicon targets used with the aim of increasing their electrical conductivity and thus facilitating their deposition by magnetron cathode sputtering. The silicon nitride may be stoichiometric in nitrogen, substoichiometric in nitrogen, or even superstoichiometric in nitrogen. In order for it to play its role of barrier to oxygen fully, the oxygen barrier layer (in particular when it is based on or essentially consists of silicon nitride) preferably possesses a physical thickness of at least 3 nm, in particular of 4 nm or 5 nm. Its physical thickness is advantageously at most 50 nm, in particular 40 or 30 nm.

The oxygen barrier layer may be the only layer deposited between the TCO layer and the thin homogenizing layer.

Alternatively, another layer may be deposited between the oxygen barrier layer and the thin homogenizing (in particular metal) layer. It may be in particular a silicon oxide-based layer and advantageously a silica layer, in order to decrease the amount of light reflected from the stack. It will be understood that silica may be doped or not be stoichiometric. By way of example, silica may be doped with aluminum or boron atoms with the aim of facilitating its deposition by cathode sputtering processes. The physical thickness of this silicon oxide-based layer is preferably comprised in a range extending from 20 to 100 nm, in particular from 30 nm to 90 nm and even from 40 to 80 nm.

The various preferred embodiments described above may of course be combined with one another, even though all the possible combinations are not explicitly described in the present text in order not to lengthen it unnecessarily. Before the heat treatment, the stack of thin-layers may consist in succession starting from the substrate of a TCO layer, an oxygen barrier layer and a homogenizing layer. It may also consist, in succession starting from the substrate, of a neutralizing stack consisting of a high-index layer then a low-index layer, a TCO layer, an oxygen barrier layer and a homogenizing layer. It may even consist, in succession starting from the substrate, of a neutralizing stack consisting of a high-index layer then a low-index layer, a TCO layer, an oxygen barrier layer, a silicon-oxide-based layer and a thin homogenizing layer. Preferably, the or each TCO is an ITO layer and the thin homogenizing layer is a layer of titanium or zirconium.

A few example stacks before the heat treatment are given below:

Glass/$SiN_x$/$SiO_x$/ITO/$SiN_x$/$SiO_x$/Ti
Glass/SiN/$TiO_x$/$SiO_xN_y$/ITO/$SiN_x$/Zr
Glass/Si(O)$N_x$/ITO/Si(O)$N_x$/Ti
Glass/$SiN_x$/$SiO_x$/ITO/$SiO_x$/ITO/$SiN_x$/$SiO_x$/Ti This type of stack, and generally the type of stack described above may have various applications. Deposited on face 1 of glazing units (the face turned toward the exterior of the dwelling), they provide a condensation-reducing function. Deposited on face 2 of a single glazing unit, on face 4 of a double glazing unit or a laminated glazing unit, or even on face 6 of a triple glazing unit, they improve, via their low emissivity, the thermal insulation of buildings, automotive vehicles or even domestic ovens or refrigerators equipped therewith.

When the item is intended to be an electrode, the stack may comprise only the TCO layer and the homogenizing layer, the latter preferably being under the TCO layer.

The heat treatment is preferably intended to improve the crystallization of the TCO layer, in particular by increasing the size of the crystals and/or the quantity of crystal phase.

Preferably, the heat treatment step does not involve even partial melting of the coating. In the case where the treatment is intended to improve the crystallization of the coating, the heat treatment allows a sufficient amount of energy to be delivered to promote crystallization of the coating via a physico-chemical mechanism of crystal growth about seeds already present in the coating, while the latter remains in the solid state. This treatment does not implement a crystallization mechanism involving cooling of a molten material, on the one hand because it would require extremely high temperatures, and on the other hand because it would be liable to modify the thicknesses or refractive indices of the coating, and therefore its properties, for example causing its optical appearance to change.

According to one preferred embodiment, the radiation is emitted by at least one flash lamp.

Such lamps generally take the form of glass or quartz tubes that are sealed and filled with a noble gas and that are equipped with electrodes at their ends. Under the effect of a short electrical pulse, obtained by discharging a capacitor, the gas ionizes and produces a particularly intense burst of incoherent light. The emission spectrum generally comprises at least two emission lines; it is preferably a continuous spectrum having an emission maximum in the near ultraviolet.

The lamp is preferably a xenon lamp. It may also be an argon lamp, a helium lamp or a krypton lamp. The emission spectrum preferably comprises a plurality of lines, in particular at a wavelength ranging from 160 to 1000 nm.

The length of the flash is preferably comprised in a range extending from 0.05 to 20 milliseconds, in particular from 0.1 to 5 milliseconds. The repetition rate is preferably comprised in a range extending from 0.1 to 5 Hz, in particular from 0.2 to 2 Hz.

The radiation may be emitted by a plurality of lamps placed side-by-side, for example 5 to 20 lamps, or even 8 to 15 lamps, so as to simultaneously treat a larger region. All the lamps may in this case emit flashes simultaneously.

The or each lamp is preferably placed transversely to the longest sides of the substrate. The or each lamp is preferably at least 1 m in length, in particular 2 m and even 3 m in length so as to allow large substrates to be treated.

The capacitor is typically charged at a voltage from 500 V to 500 kV. The current density is preferably at least 4000 $A/cm^2$. The total energy density emitted by the flash lamps, divided by the area of the coating, is preferably comprised between 1 and 100 $J/cm^2$, in particular between 1 and 30 $J/cm^2$ and even between 5 and 20 $J/cm^2$.

According to another preferred embodiment, the radiation is laser radiation focused on said coating in the form of at least one laser line.

The laser radiation is preferably generated by modules comprising one or more laser sources and shaping and redirecting optics.

The laser sources are typically laser diodes or fiber-delivered lasers, in particular fiber lasers, diode lasers or even disk lasers. Laser diodes allow high power densities, relative to the electrical supply power, to be achieved economically and with a small footprint. The footprint of fiber-delivered lasers is even smaller, and the power per unit length obtained may be even higher, at the expense of a higher cost. The expression "fiber-delivered lasers" is understood to mean lasers in which the place where the laser light is generated is spatially removed from the place to which it is delivered, the laser light being delivered by means of at least one optical fiber. In the case of a disk laser, the laser light is generated in a resonant cavity in which the emitting medium, which takes the form of a disk, for example a thin (about 0.1 mm in thickness) disk made of Yb:YAG, is found. The light thus generated is coupled to at least one optical fiber directed toward the place of treatment. Fiber or disk lasers are preferably optically pumped using laser diodes.

The laser sources preferably emit radiation continuously.

The wavelength of the laser radiation is preferably comprised in a range extending from 500 to 2000 nm, in particular from 700 to 1100 nm and even from 800 to 1000 nm. Power laser diodes emitting at one or more wavelengths chosen from 808 nm, 880 nm, 915 nm, 940 nm or 980 nm have proved to be particularly suitable. In the case of a disk laser, the wavelength is for example 1030 nm (emission wavelength of a Yb:YAG laser). For a fiber laser, the wavelength is typically 1070 nm.

In the case of lasers not delivered by fiber, the shaping and redirecting optics preferably comprise lenses and mirrors and are used as means for positioning, homogenizing and focusing the radiation.

The aim of the positioning means is, if needs be, to arrange the radiation emitted by the laser sources in a line. Said means preferably comprise mirrors. The aim of the homogenizing means is to superpose the spatial profiles of the laser sources in order to obtain a homogeneous power per unit length all the way along the line. The homogenizing means preferably comprise lenses allowing the incident beams to be separated into secondary beams and said secondary beams to be recombined into a homogenous line. The means for focusing the radiation allow the radiation to be focused on the coating to be treated, in the form of a line of the desired length and width. The focusing means preferably comprise a focusing mirror or a convergent lens.

In the case of fiber-delivered lasers, the shaping optics are preferably assembled in the form of an optical head positioned at the exit of the or each optical fiber.

The shaping optics of said optical head preferably comprise lenses, mirrors and prisms and are used as means for converting, homogenizing and focusing the radiation.

The converting means comprise mirrors and/or prisms and serve to convert the circular beam, output from the optical fiber, into a noncircular, anisotropic, line-shaped beam. To do this, the converting means increase the quality of the beam along one of its axes (fast axis, or axis of the width l of the laser line) and decrease the quality of the beam along the other (slow axis, or axis of the length L of the laser line).

The homogenizing means superpose the spatial profiles of the laser sources in order to obtain a homogeneous power per unit length all the way along the line. The homogenizing means preferably comprise lenses allowing the incident beams to be separated into secondary beams and said secondary beams to be recombined into a homogeneous line.

Lastly, the means for focusing the radiation allow the radiation to be focused on the working plane, i.e. on the plane of the coating to be treated, in the form of a line of the desired length and width. The focusing means preferably comprise a focusing mirror or a convergent lens.

When a single laser line is used, the length of the line is advantageously equal to the width of the substrate. This length is typically at least 1 m, in particular 2 m and even 3 m. A plurality of optionally separate lines may also be used, provided these lines are arranged to treat the entire width of the substrate. In this case, the length of each laser line is preferably at least 10 cm or 20 cm, in particular comprised in a range extending from 30 to 100 cm, in particular from 30 to 75 cm and even from 30 to 60 cm.

The "length" of the line is understood to be its largest dimension as measured on the surface of the coating in the first direction, and the "width" of the line its dimension in the second direction. As is conventional in the field of lasers, the width w of the line corresponds to the distance (in this second direction) between the axis of the beam (on which the intensity of the radiation is maximal) and the point where the intensity of the radiation is equal to $1/e^2$ times the maximum intensity. If the longitudinal axis of the laser line is denoted x, a width distribution denoted w(x) may be defined along this axis.

The average width of the or each laser line is preferably at least 35 micrometers, in particular comprised in a range extending from 40 to 100 micrometers or from 40 to 70 micrometers. Throughout the present text, the term "average" is understood to mean the arithmetic mean. Over the entire length of the line, the width distribution is narrow in order to limit as much as possible any treatment heterogeneity. Thus, the difference between the largest width and the smallest width is preferably at most 10% of the value of the average width. This value is preferably at most 5% and even 3%.

The shaping and redirecting optics, in particular the positioning means, may be adjusted manually or using actuators allowing how far away they are to be adjusted. These actuators (typically motors or piezoelectric actuators) may be controlled manually and/or adjusted automatically. In the latter case, the actuators will preferably be connected to detectors and to a feedback loop.

At least some of the laser modules and even all of them are preferably placed in a sealed enclosure that is advantageously cooled, in particular fan-cooled, in order to ensure their thermal stability.

The laser modules are preferably mounted on a rigid structure, called a "bridge", based on metal elements that are typically made of aluminum. The structure preferably does not comprise a marble sheet. The bridge is preferably positioned parallel to the conveying means so that the focal plane of the or each laser line remains parallel to the surface of the substrate to be treated. Preferably, the bridge comprises at least four feet, the height of which may be individually adjusted in order to ensure, whatever the case may be, that the bridge and conveying means are parallel to each other. The adjustment may be achieved by way of motors located in each foot, either manually, or automatically by means of a distance sensor. The height of the bridge may be modified (manually or automatically) to take into account the thickness of the substrate to be treated, and thus ensure that the plane of the substrate coincides with the focal plane of the or each laser line.

The power per unit length of the laser line is preferably at least 300 W/cm, advantageously 350 or 400 W/cm, in particular 450 W/cm, even 500 W/cm and even 550 W/cm. It is even advantageously at least 600 W/cm, in particular 800 W/cm and even 1000 W/cm. The power per unit length is measured in the focal plane of the or each laser line on the coating. It may be measured by placing a power detector on the line, for example a calorimetric power meter, in particular such as the Beam Finder (S/N 2000716) power meter sold by Coherent Inc. The power is advantageously distributed homogeneously over the entire length of the or each line. Preferably, the difference between the highest power and the lowest power is less than 10% of the average power.

The energy density delivered to the coating is preferably at least 20 J/cm$^2$ and even 30 J/cm$^2$.

High energy densities and powers allow the coating to be very rapidly heated without heating the substrate significantly.

The maximum temperature experienced by each point of the coating during the heat treatment is preferably at least 300° C., in particular 350° C., even 400° C. and even 500° C. or 600° C. The maximum temperature is normally experienced at the moment when the point of the coating in question passes under the radiating device, for example under the laser line or under the flash lamp. At a given instant, only those points of the surface of the coating which are located under the radiating device (for example under the laser line) and in its immediate vicinity (for example at a distance of less than one millimeter) are normally at a temperature of at least 300° C. For distances to the laser line (measured in the run direction) larger than 2 mm, in particular 5 mm, including downstream of the laser line, the temperature of the coating is usually at most 50° C. and even at most 40° C. or 30° C.

Each point of the coating undergoes the heat treatment (or is raised to the maximum temperature) for a length of time advantageously comprised in a range extending from 0.05 to 10 ms, in particular from 0.1 to 5 ms or from 0.1 to 2 ms. In the case of a treatment by means of a laser line, this length of time is set both by the width of the laser line and by the speed of the relative movement between the substrate and the laser line. In the case of a treatment by means of a flash lamp, this length of time corresponds to the length of the flash.

The laser radiation is partially reflected by the coating to be treated and partially transmitted through the substrate. For reasons of safety, it is preferable to place, on the path of this reflected and/or transmitted radiation, means for stopping the radiation. It is typically metal jackets cooled by a flow of fluid, in particular water. In order to prevent the reflected radiation from damaging the laser modules, the axis of propagation of the or each laser line preferably makes a nonzero angle with the normal to the substrate, typically an angle comprised between 5 and 20°.

In order to increase the efficiency of the treatment, it is preferable for at least some of the (main) laser ray transmitted through the substrate and/or reflected by the coating to be redirected toward said substrate in order to form at least one secondary laser ray, said secondary ray preferably impacting the substrate in the same place as the main laser ray and advantageously having the same focal depth and the same profile. The or each secondary laser ray is advantageously formed using an optical assembly comprising only optical elements chosen from mirrors, prisms and lenses, in particular an optical assembly consisting of two mirrors and a lens, or a prism and a lens. Recovering at least some of the main radiation lost and directing it toward the substrate considerably improves the heat treatment. The choice of whether to use the portion of the main ray transmitted through the substrate ("transmission" mode), the portion of the main ray reflected by the coating ("reflection" mode) or optionally both, depends on the nature of the layer and the wavelength of the laser radiation.

When the substrate moves, in particular translationally, it may be made to move using any mechanical conveying means, for example using belts, rollers or trays to provide a translational movement. The conveying system allows the speed of the movement to be controlled and adjusted. The conveying means preferably comprises a rigid chassis and a plurality of rollers. The pitch of the rollers is advantageously comprised in a range extending from 50 to 300 mm. The rollers preferably comprise metal rings, typically made of steel, covered with plastic covers. The rollers are preferably mounted on low-play end bearings, with typically three rollers per end bearing. In order to ensure the plane of conveyance is perfectly planar, the position of each of the rollers is advantageously adjustable. The rollers are preferably moved using pinions or chains, preferably tangential chains, driven by at least one motor.

The speed of the relative movement between the substrate and the or each radiation source (in particular the or each laser'line) is advantageously at least 2 m/min or 4 m/min, in particular 5 m/min and even 6 m/min or 7 m/min, or even 8 m/min and even 9 m/min or 10 m/min. According to certain embodiments, in particular when the absorption of the radiation by the coating is high or when the coating may be deposited at high deposition rates, the speed of the relative movement between the substrate and the radiation source (in particular the or each laser line or flash lamp) is at least 12 m/min or 15 m/min, in particular 20 m/min and even 25 or 30 m/min. In order to ensure the treatment is as homogeneous as possible, the speed of the relative movement between the substrate and the or each radiation source (in particular the or each laser line or flash lamp) varies during the treatment by most 10 rel %, in particular 2 rel % and even 1 rel % relative to its nominal value.

Preferably, the or each radiation source (in particular laser line or flash lamp) is stationary, and the substrate moves, so that the speed of the relative movement corresponds to the run speed of the substrate.

The heat treatment device may be integrated into a layer deposition line, for example a magnetron cathode sputtering (magnetron process) deposition line, or a chemical vapor deposition (CVD) deposition line, in particular a vacuum plasma-enhanced chemical vapor deposition (PECVD) or atmospheric-pressure plasma-enhanced chemical vapor deposition (APPECVD) deposition line. The line generally comprises substrate handling devices, a deposition tool, optical inspecting devices and stacking devices. The substrates run, for example on conveying rollers, in succession in front of each device or each tool.

The heat treatment device is preferably located just after the coating deposition tool, for example at the exit of the deposition tool. The coated substrate may thus be treated in line after the coating has been deposited, at the exit of the deposition tool and before the optical inspecting devices, or after the optical inspecting devices and before the devices for stacking the substrates.

The heat treatment device may also be integrated into the deposition tool. For example, the laser or flash lamp may be installed in one of the chambers of a cathode sputtering deposition tool, in particular in a chamber the atmosphere of which is rarefied, in particular at a pressure comprised between $10^{-6}$ mbar and $10^{-2}$ mbar. The heat treatment device may also be placed outside of the deposition tool but so as to treat a substrate located inside said tool. All that is required to do this is for a porthole that is transparent to the wavelength of the radiation used to be provided, through which porthole the radiation will be transmitted to treat the layer. It is thus possible to treat a layer (for example a silver layer) before the subsequent deposition of another layer in the same tool.

Independently of whether the heat treatment device is located outside of or integrated into the deposition tool, these "in line" processes are preferable to rework processes that require the glass substrates to be stacked between the deposition step and the heat treatment.

Rework processes may however be advantageous in the case where the heat treatment according to the invention is carried out at a different site to that at which the deposition is carried out, for example a site where the glass is transformed. The heat treatment device may therefore be integrated into other lines than the layer deposition line. It may for example be integrated into a line for manufacturing multiple glazing units (in particular double or triple glazing units), into a line for manufacturing laminated glazing units, or even into a line for manufacturing curved and/or tempered glazing units. The laminated or curved or tempered glazing units may be used in architectural or automotive applications. In any case, the heat treatment according to the invention is preferably carried out before the laminated or multiple glazing unit is assembled. The heat treatment may however be carried out after the double glazing unit or laminated glazing unit has been assembled.

The heat treatment device is preferably placed in a closed vessel that ensures the personnel remain safe by preventing any contact with the radiation and preventing any contamination—in particular of the substrate, of the optics or of the treatment region.

The stack is preferably deposited by cathode sputtering, in particular magnetron cathode sputtering.

The stack may be deposited on the substrate using other processes, such as a chemical vapor deposition (CVD) process, in particular a plasma-enhanced chemical vapor deposition (PECVD) process, a vacuum evaporation process or even a sol-gel process.

For greater simplicity, the heat treatment of the stack may preferably be carried out under air and/or at atmospheric pressure. It is however possible to carry out the heat treatment of the stack in a vacuum deposition chamber, for example before a subsequent deposition.

Another subject of the invention is an item obtainable by way of the process of the invention.

Another subject of the invention is a single, multiple or laminated glazing unit, a mirror, a glass wall coating, an oven door or a fireplace insert comprising at least one item according to the invention.

The coating may be positioned on face 1 of the glazing unit in order to provide it with anti-condensation properties, thereby limiting or preventing the appearance of condensation or frost. The coating may be positioned on face 4 of a double glazing unit or on face 6 of a triple glazing unit in order to improve its thermal insulation performance, in particular in association with other low-emissivity coatings on face 2 or 3. For the same reasons, the coating may also be positioned on face 4 of a laminated glazing unit, used for example as an automotive vehicle windshield. The glazing unit may in particular be fire resistant.

Another subject of the invention is a photovoltaic cell, display screen or active glazing unit comprising at least one item according to the invention, the coating being used as an electrode.

The display screens are for example LCD (liquid crystal display), PDP (plasma display panel), OLED (organic light-emitting diode) or FED (field emission display) display screens. The active glazing units are in particular glazing units the transparency of which is electrically controllable, in particular of the electrochromic or liquid-crystal type.

The invention is illustrated by way of the following nonlimiting example embodiments.

FIRST SERIES OF EXAMPLES

Three different stacks were deposited by magnetron cathode sputtering on 4 mm-thick soda-lime-silica glass substrates.

The nature of the layers and the physical thickness of the layers (in nm) are indicated below for each of the stacks:

1: Glass/$SiN_x$ (19)/$SiO_x$ (24)/ITO (106)/$SiN_x$ (8)/$SiO_x$ (40)/Ti (6)
2: Glass/$SiN_x$ (19)/$SiO_x$ (24)/ITO (106)/$SiN_x$ (8)/$SiO_x$ (40)/$TiO_x$ (11)
3: Glass/$SiN_x$ (19)/$SiO_x$ (24)/ITO (106)/$SiN_x$ (8)/$SiO_x$ (40)/C (6)
4: Glass/$SiN_x$ (10)/$SiO_x$ (30)/ITO (120)/$SiN_x$ (5)/$SiO_x$ (40)/Ti (4)
5: Glass/$SiN_x$ (10)/$SiO_x$ (30)/ITO (60)/$SiO_x$ (20 or 40)/ITO (60)/$SiN_x$ (5)/$SiO_x$ (40)/Ti (4)

Examples 1, 4 and 5 are examples according to the invention since the stack comprises a metal homogenizing layer, in this case made of titanium. Relative to example 4, example 5 comprises two ITO layers separated by an $SiO_x$ layer with a physical thickness of 20 or 40 nm depending on the trial. The total ITO thickness was the same in both cases (120 nm).

Examples 2 and 3 are comparative examples, the titanium layer being replaced by a titanium oxide layer and a carbon layer, respectively.

The indices "x" indicate that the exact stoichiometry of the layers is unknown. The formulae $SiN_x$ or $SiO_x$ do not preclude the presence of dopants. In practice, these layers contain a small quantity of aluminum atoms because they are obtained by sputtering silicon targets doped with aluminum in order to increase their electrical conductivity.

For example 1, the ITO layer was deposited so that its light absorption was 4.4%. The ratio of its light absorption to its thickness was therefore 0.42 $\mu m^{-1}$.

The substrates thus coated were then run under a stationary device emitting laser radiation in the form of a line focused on the stack. The average width of the laser line was 45 μm and the power per unit length was between 250 and 500 W/cm depending on the trial. The laser radiation superposed two wavelengths: 915 and 980 nm. Various run rates between 3 and 20 m/min were tested.

In the case of examples 1 and 2, a relative improvement in sheet resistance of as high as 60% was obtained. However, for example 1 the improvement was observed to be weakly dependent on the power per unit length of the laser and the movement speed, and the relative improvement was always comprised between 50 and 60%. In contrast the improvement in sheet resistance for example 2 was observed to be clearly more dependent on the operating conditions of the laser line. Fluctuations in power and/or width over the length of the line or over time could therefore lead to large variations in the improvement obtained.

In the case of example 3, the decrease in sheet resistance is clearly less and the carbon is not totally removed, to the point that the stack obtained had a low transmission.

In the case of example 4, the larger thickness of ITO had the consequence of slightly degrading the treatment homogeneity when the latter was carried out at high speed, for example at 20 m/min. In particular, the improvement in sheet resistance proved to be more dependent on treatment speed than for example 1. Dividing the thick ITO layer (example 5) into two allowed a perfect stability to once more be obtained.

Figure 1:
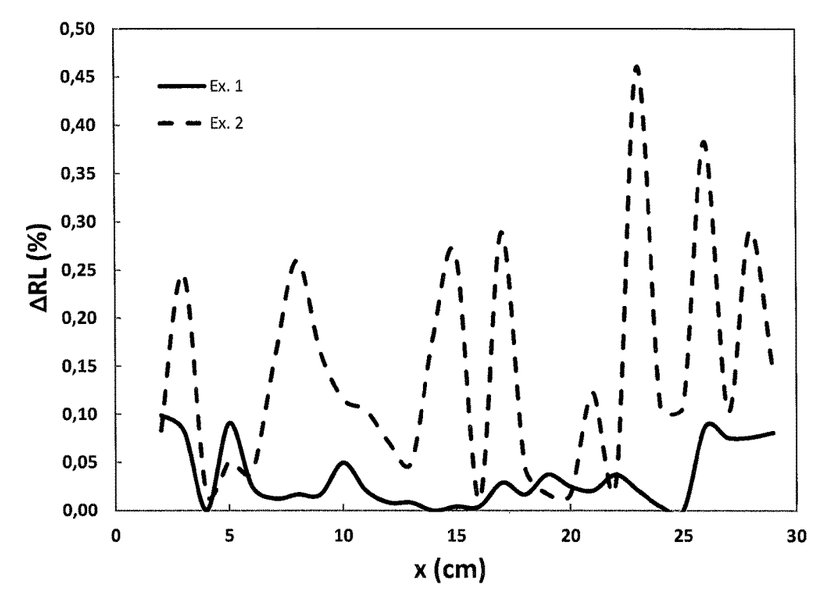
FIG. 1 illustrates the spatial variation of the light reflection over the samples obtained in examples 1 and 2 for a power per unit length of 490 W/cm.

FIG. 1 illustrates the spatial variation of the light reflection over the samples obtained in examples 1 and 2 for a power per unit length of 490 W/cm. From one edge of the sample, the light reflection was measured every centimeter over a length of 30 cm. The x-axis of FIG. 1 indicates the position on the sample, denoted x, and the y-axis of FIG. 1 the absolute variation in light reflection relative to the preceding measure, denoted ΔRL.

In the case of example 2, the light reflection varied quite strongly as a function of position on the sample. In contrast, using a homogenizing layer according to the invention allowed, in the case of example 1, the homogeneity of the final product to be considerably improved, the spatial variation in light reflection being close to zero and always lower than 0.1%.

Second Series of Example

This series of examples used the same stack as example 1 above (example 6), and by way of comparative example 7 the same stack without the titanium homogenizing layer.

Substrates coated with these stacks were run under a stationary xenon flash lamp emitting incoherent radiation in a wavelength range extending from 250 to 2500 nm and concentrated on the stacks in the form of bands of 6.5 cm width and 20 cm length.

Energy densities of 10 to 30 J/cm$^2$ (corresponding to charging voltages of the capacitor of between 2500 and 4500 V) were used. The flashes (pulses) were 3 ms in length, with a repetition rate of 0.5 Hz. The run speeds tested were comprised between 0.1 and 1 m/min.

An improvement in sheet resistance of as high as 60% was obtained.

It was observed that in the case of example 6 according to the invention, the optical appearance of the stack was not very dependent on energy density and therefore on the operating conditions of the lamp. In particular, the value of the b* color coordinate in reflection varied from −4 to −4.5 depending on the charging voltage of the capacitor.

In contrast, in the case of comparative example 7, the appearance of the layer varied greatly depending on the operating conditions of the lamp. The b* coordinate, which was −1 for a charging voltage of 3400 V decreased to −4 for a charging voltage of 4200 V. Treatment heterogeneities would therefore be liable to create very visible heterogeneities in the stack.

The invention claimed is:

1. A process for obtaining an item comprising a substrate made of glass or glass ceramic coated on at least one portion of at least one of its faces with a stack of layers comprising no silver layers and comprising at least one layer of a transparent electrically conductive oxide, said process comprising:

a step of depositing said stack, in which step said layer of a transparent electrically conductive oxide and a homogenizing layer are deposited, said homogenizing layer being a layer of metal, said homogenizing layer being a last layer of the stack so that said metal at an upper surface of the homogenizing layer is in contact with an outside atmosphere; then a heat treatment step in which said stack is exposed to radiation.

2. The process as claimed in claim 1, wherein the transparent conductive oxide is chosen from indium tin oxide, indium zinc oxide, antimony- or fluorine-doped tin oxide, aluminum- and/or gallium- and/or titanium-doped zinc oxide, niobium- and/or tantalum-doped titanium oxide and zinc or cadmium stannate.

3. The process as claimed in claim 2, wherein the transparent conductive oxide is indium tin oxide.

4. The process as claimed in claim 1, wherein a physical thickness of the layer of a transparent electrically conductive oxide is at least 30 nm.

5. The process as claimed in claim 4, wherein the physical thickness of the layer of a transparent electrically conductive oxide is at least 50 nm.

6. The process as claimed in claim 1, wherein a ratio of the light absorption to a physical thickness of the layer of a transparent electrically conductive oxide is comprised in a range extending from 0.1 to 0.9 μm$^{-1}$ before heat treatment.

7. The process as claimed in claim 6, wherein the ratio is in the range extending from 0.2 to 0.7 μm$^{-1}$ before heat treatment.

8. The process as claimed in claim 1, wherein the stack comprises a plurality of layers of a transparent conductive oxide.

9. The process as claimed in claim 1, wherein the homogenizing layer is located above the layer of a transparent electrically conductive oxide.

10. The process as claimed in claim 1, wherein the homogenizing layer is a metal layer chosen from layers of a metal chosen from titanium, tin, zirconium, zinc, aluminum, cerium or any one of their alloys.

11. The process as claimed in claim 10, wherein the metal is titanium.

12. The process as claimed in claim 10, wherein the metal layer is an alloy of tin and zinc.

13. The process as claimed in claim 1, wherein a physical thickness of the homogenizing layer is at most 15 nm.

14. The process as claimed in claim 13, wherein the physical thickness of the homogenizing layer is at most 8 nm.

15. The process as claimed in claim 1, wherein the radiation is emitted by at least one flash lamp.

16. The process as claimed in claim 15, wherein the at least one flash lamp is a xenon flash lamp.

17. The process as claimed in claim 1, wherein the radiation is laser radiation focused on said stack in the form of at least one laser line.

18. The process as claimed in claim 17, wherein a wavelength of the laser radiation is comprised in a range extending from 500 to 2000 nm.

19. The process as claimed in claim 18, wherein the wavelength of the laser radiation is comprised in the range extending from 700 to 1100 nm.

20. The process as claimed in claim 1, wherein the stack comprises two or three layers of a transparent conductive oxide.

21. The process as claimed in claim 1, wherein a physical thickness of the layer of a transparent electrically conductive oxide is at most 5000 nm.

22. The process as claimed in claim 1, wherein the homogenizing layer is fully oxidized during the heat treatment.

23. The process as claimed in claim 1, wherein the stack comprises an oxygen barrier layer between the layer of a transparent electrically conductive oxide and the homogenizing layer.

* * * * *